(12) United States Patent
Swaminathan et al.

(10) Patent No.: US 9,214,334 B2
(45) Date of Patent: Dec. 15, 2015

(54) HIGH GROWTH RATE PROCESS FOR CONFORMAL ALUMINUM NITRIDE

(71) Applicant: Lam Research Corporation, Fremont, CA (US)

(72) Inventors: Shankar Swaminathan, Beaverton, OR (US); Ananda Banerji, West Linn, OR (US); Nagraj Shankar, Tualatin, OR (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/183,287

(22) Filed: Feb. 18, 2014

(65) Prior Publication Data

US 2015/0235835 A1    Aug. 20, 2015

(51) Int. Cl.
*H01L 21/02* (2006.01)
*H01L 21/28* (2006.01)
*H01L 21/314* (2006.01)
*C23C 16/52* (2006.01)
*C23C 16/455* (2006.01)
*C23C 16/458* (2006.01)

(52) U.S. Cl.
CPC .......... *H01L 21/0228* (2013.01); *C23C 16/458* (2013.01); *C23C 16/45544* (2013.01); *C23C 16/52* (2013.01); *H01L 21/02178* (2013.01); *H01L 21/02274* (2013.01); *H01L 21/28194* (2013.01); *H01L 21/3141* (2013.01)

(58) Field of Classification Search
CPC ..................... H01L 21/02274; H01L 21/0228; H01L 21/28194; H01L 21/3141; C23C 16/52; C23C 16/45525

See application file for complete search history.

(56) References Cited

U.S. PATENT DOCUMENTS

| | | | |
|---|---|---|---|
| 4,500,563 | A | 2/1985 | Ellenberger et al. |
| 5,223,443 | A | 6/1993 | Chinn et al. |
| 5,496,608 | A | 3/1996 | Matsuda et al. |
| 5,593,914 | A | 1/1997 | Evans, Jr. et al. |
| 5,670,432 | A | 9/1997 | Tsai |
| 5,856,003 | A | 1/1999 | Chiu |

(Continued)

FOREIGN PATENT DOCUMENTS

| | | |
|---|---|---|
| EP | 0 277 766 | 8/1988 |
| EP | 0 541 212 | 5/1993 |

(Continued)

OTHER PUBLICATIONS

U.S. Appl. No. 14/607,997, filed Jan. 28, 2015, entitled "Plasma Activated Conformal Dielectric Film Deposition".

(Continued)

*Primary Examiner* — Thanhha Pham
(74) *Attorney, Agent, or Firm* — Weaver Austin Villeneuve & Sampson LLP

(57) ABSTRACT

Methods of depositing conformal aluminum nitride films on semiconductor substrates are provided. Disclosed methods involve (a) exposing a substrate to an aluminum-containing precursor, (b) purging the aluminum-containing precursor for a duration insufficient to remove substantially all of the aluminum-containing precursor in gas phase, (c) exposing the substrate to a nitrogen-containing precursor to form aluminum nitride, (d) purging the nitrogen-containing precursor, and (e) repeating (a) through (d). Increased growth rate and 100% step coverage and conformality are attained.

15 Claims, 6 Drawing Sheets

(56) References Cited

U.S. PATENT DOCUMENTS

| | | |
|---|---|---|
| 5,874,368 A | 2/1999 | Laxman et al. |
| 5,932,286 A | 8/1999 | Beinglass et al. |
| 6,270,572 B1 | 8/2001 | Kim et al. |
| 6,346,741 B1 | 2/2002 | Van Buskirk et al. |
| 6,391,803 B1 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,509,601 B1 | 1/2003 | Lee et al. |
| 6,528,430 B2 | 3/2003 | Kwan et al. |
| 6,551,893 B1 | 4/2003 | Zheng et al. |
| 6,576,053 B1 | 6/2003 | Kim et al. |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,109,129 B1 | 9/2006 | Papasouliotis |
| 7,115,528 B2 | 10/2006 | Vaartstra et al. |
| 7,122,222 B2 | 10/2006 | Xiao et al. |
| 7,122,464 B2 | 10/2006 | Vaarstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,758,920 B2 | 7/2010 | Hasebe et al. |
| 7,776,733 B2 | 8/2010 | Hasegawa |
| 7,825,039 B2 | 11/2010 | Takahashi et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,956 B2 | 5/2014 | LaVoie et al. |
| 8,956,983 B2 | 2/2015 | Swaminathan et al. |
| 8,999,859 B2 | 4/2015 | Swaminathan et al. |
| 9,076,646 B2 | 7/2015 | Sims et al. |
| 2002/0076507 A1 | 6/2002 | Chiang et al. |
| 2003/0008070 A1 | 1/2003 | Seutter et al. |
| 2003/0024477 A1 | 2/2003 | Okuda et al. |
| 2003/0200917 A1 | 10/2003 | Vaartstra |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0219746 A1 | 11/2004 | Vaartstra et al. |
| 2004/0231799 A1 | 11/2004 | Lee et al. |
| 2005/0042865 A1 | 2/2005 | Cabral et al. |
| 2005/0109276 A1 | 5/2005 | Iyer et al. |
| 2005/0118837 A1 | 6/2005 | Todd et al. |
| 2005/0159017 A1 | 7/2005 | Kim et al. |
| 2005/0181535 A1 | 8/2005 | Yun et al. |
| 2005/0196977 A1 | 9/2005 | Saito et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0287775 A1 | 12/2005 | Hasebe et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0199357 A1 | 9/2006 | Wan et al. |

(56) References Cited

U.S. PATENT DOCUMENTS

| | | |
|---|---|---|
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0065576 A1 | 3/2007 | Singh et al. |
| 2007/0134942 A1 | 6/2007 | Ahn et al. |
| 2007/0137572 A1 | 6/2007 | Matsuura et al. |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1* | 10/2007 | Ishizaka .............. 427/249.17 |
| 2007/0232082 A1 | 10/2007 | Balseanu et al. |
| 2007/0251444 A1 | 11/2007 | Gros et al. |
| 2007/0259110 A1 | 11/2007 | Mahajani et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0139003 A1 | 6/2008 | Pirzada et al. |
| 2008/0213479 A1 | 9/2008 | Chou et al. |
| 2008/0242116 A1 | 10/2008 | Clark |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0096688 A1 | 4/2010 | Balseanu et al. |
| 2010/0099236 A1 | 4/2010 | Kwon et al. |
| 2010/0102417 A1 | 4/2010 | Ganguli et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0167555 A1 | 7/2010 | Maula et al. |
| 2010/0221925 A1 | 9/2010 | Lee et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0064969 A1 | 3/2011 | Chen et al. |
| 2011/0086516 A1 | 4/2011 | Lee et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1 | 3/2012 | Li et al. |
| 2012/0108079 A1 | 5/2012 | Mahajani |
| 2012/0113672 A1 | 5/2012 | Dubrow et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0058161 A1 | 3/2013 | Yamanaka et al. |
| 2013/0058162 A1 | 3/2013 | Yamanaka et al. |
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0309415 A1 | 11/2013 | Swaminathan et al. |
| 2013/0319329 A1 | 12/2013 | Li et al. |
| 2014/0030444 A1 | 1/2014 | Swaminathan et al. |
| 2014/0051262 A9 | 2/2014 | Lavoie et al. |
| 2014/0106574 A1 | 4/2014 | Kang et al. |
| 2014/0113457 A1 | 4/2014 | Sims et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0264555 A1 | 9/2014 | Ahn et al. |
| 2014/0302686 A1 | 10/2014 | Pan et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |

FOREIGN PATENT DOCUMENTS

| | | |
|---|---|---|
| EP | 2 278 046 | 1/2011 |
| JP | 4364320 | 8/2009 |
| JP | 2010-10497 | 1/2010 |
| KR | 10-2001-0111448 | 12/2001 |
| KR | 10-2004-0003036 | 1/2004 |
| KR | 10-2009-0057665 | 6/2009 |
| KR | 10-2009-0080019 | 7/2009 |
| KR | 10-2009-0081396 | 7/2009 |
| WO | WO 2006/026350 | 3/2006 |
| WO | WO 2006/104741 | 10/2006 |
| WO | WO 2007/118026 | 10/2007 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/112727 | 8/2013 |

OTHER PUBLICATIONS

U.S. Appl. No. 14/194,549, filed Feb. 28, 2014, entitled "Capped ALD Films for Doping Fin-Shaped Channel Regions of 3-D IC Transistors."

U.S. Appl. No. 14/187,145, filed Feb. 21, 2014, entitled "Plasma Assisted Atomic Layer Deposition Titanium Oxide for Conformal Encapsulation and Gap Fill Applications."

U.S. Appl. No. 14/335,785, filed Jul. 18, 2014, entitled "Methods for Depositing Silicon Oxide."

U.S. Appl. No. 14/552,011, filed Nov. 24, 2014, entitled "Selective Inhibition in Atomic Layer Deposition of Silicon-Containing Films."

U.S. Appl. No. 14/678,736, filed Apr. 3, 2015, entitled "Deposition of Conformal Films by Atomic Layer Deposition and Atomic Layer Etch."

US Office Action dated Jan. 2, 2015 issued in U.S. Appl. No. 14/231,554.

(56) References Cited

OTHER PUBLICATIONS

US Final Office Action dated Jun. 10, 2015 issued in U.S. Appl. No. 14/231,554.
US Notice of Allowance dated Aug. 7, 2014 issued U.S. Appl. No. 14/133,239.
US Notice of Allowance dated Nov. 26, 2014 issued U.S. Appl. No. 14/133,239.
US Examiner's Answer to Appeal Brief (filed May 22, 2014) Before the Patent Trial and Appeal Board dated Aug. 14, 2014 issued U.S. Appl. No. 13/224,240.
US Office Action dated May 21, 2014 issued in U.S. Appl. No. 13/607,386.
US Notice of Allowance dated Oct. 8, 2014 issued in U.S. Appl. No. 13/607,386.
US Notice of Allowance dated Nov. 19, 2014 issued in U.S. Appl. No. 13/607,386.
US Office Action dated Jun. 13, 2014 issued in U.S. Appl. No. 13/953,616.
US Final Office Action dated Nov. 24, 2014 issued in U.S. Appl. No. 13/953,616.
US Office Action dated Dec. 11, 2014 issued in U.S. Appl. No. 14/074,596.
US Office Action dated May 15, 2015 issued in U.S. Appl. No. 14/074,617.
US Office Action dated Mar. 2, 2015 issued in U.S. Appl. No. 14/137,860.
US Office Action dated Jul. 10, 2014 issued in U.S. Appl. No. 14/144,107.
US Final Office Action dated Jan. 15, 2015 issued in U.S. Appl. No. 14/144,107.
US Notice of Allowance dated Mar. 19, 2015 issued in U.S. Appl. No. 14/144,107.
US Office Action dated Jul. 2, 2015 issued in U.S. Appl. No. 14/187,145.
US Office Action dated Apr. 13, 2015 issued in U.S. Appl. No. 14/335,785.
Chinese First Office Action [no translation] dated Jun. 2, 2015 issued in CN 201180045808.6.
PCT International Preliminary Report on Patentability and Written Opinion dated Apr. 3, 2014, issued in Application No. PCT/US2012/052769.
PCT International Preliminary Report on Patentability and Written Opinion dated Mar. 13, 2014, issued in Application No. PCT/US2012/051740.
European Extended Search Report dated Apr. 14, 2014 issued in EP 13 15 2046.
Korean Final Office Action dated Aug. 18, 2014 issued in KR 10-2012-0043797.
Korean Trial Decision (English description) dated May 25, 2015 issued in KR 10-2012-0043797.
PCT International Preliminary Report on Patentability and Written Opinion dated Aug. 7, 2014, issued in Application No. PCT/US2013/022977.
Kim, H., et al., (2002) "The Growth of Tantalum Thin Films by Plasma-Enhanced Atomic Layer Deposition and Diffusion Barrier Properties," Mat. Res. Soc. Symp. Proc. 716:B8.5.1-B8.5.6.
Ko, Myoung-Gyun, et al., "Characterization of ruthenium thin film deposited by rf-direct plasma atomic layer deposition," 209th ECS Meeting, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," Journal of the Korean Physical Society, 53(4):2123-2128.
Li, Xingcun, et al., (2011) "Atomic Layer Deposition Al2O3 Thin Films in Magnetized Radio Frequency Plasma Source," Physics Procedia 18:100-106.
Puurunen, Riikka L. (2005) "Surface chemistry of atomic layer deposition: A case study for the trimethylaluminum/water process," Journal of Applied Physics, 97:121301-1-121301-52.

U.S. Appl. No. 13/963,212, filed Aug. 9, 2013, entitled "Plasma-Activated Deposition of Conformal Films".
U.S. Appl. No. 14/133,239, filed Dec. 18, 2013, entitled "Plasma Activated Conformal Dielectric Film Deposition".
U.S. Appl. No. 14/065,334, filed Oct. 28, 2013, entitled "Method for Depositing a Cholrine-Free Conformal Sin Film".
U.S. Appl. No. 14/074,596, filed Nov. 7, 2013, entitled "Conformal Film Deposition for Gapfill".
U.S. Appl. No. 14/074,617, filed Nov. 7, 2013, entitled "Methods For Depositing Filsms on Sensitive Substrates".
U.S. Appl. No. 14/061,587, filed Oct. 23, 2013, entitled "Sub-Saturated Atomic Layer Deposition and Conformal Film Deposition".
U.S. Appl. No. 14/137,860, filed Dec. 20, 2013, entitled "Gapfill of Variable Aspect Ratio Features with a Composite Peald and Pecvd Method".
U.S. Appl. No. 14/144,107, filed Dec. 30, 2013, entitled "Plasma Enhanced Atomic Layer Deposition with Pulsed Plasma Exposure".
US Office Action dated Mar. 15, 2013 issued in U.S. Appl. No. 13/084,399.
US Final Office Action dated Sep. 13, 2013 issued in U.S. Appl. No. 13/084,399.
US Notice of Allowance dated Jan. 15, 2014 issued in U.S. Appl. No. 13/084,399.
US Office Action dated Sep. 14, 2012 issued in U.S. Appl. No. 13/084,305.
US Final Office Action dated Apr. 25, 2013 issued in U.S. Appl. No. 13/084,305.
US Office Action dated Apr. 13, 2011 issued in U.S. Appl. No. 12/889,132.
US Notice of Allowance dated Sep. 30, 2011 issued in U.S. Appl. No. 12/889,132.
US Office Action dated Aug. 1, 2012 issued in U.S. Appl. No. 13/011,569.
US Final Office Action dated Feb. 26, 2013 issued in U.S. Appl. No. 13/011,569.
US Notice of Allowance dated May 6, 2013 issued in U.S. Appl. No. 13/011,569.
US Office Action dated Apr. 4, 2013 issued U.S. Appl. No. 13/242,084.
US Notice of Allowance dated Jun. 19, 2013 issued U.S. Appl. No. 13/242,084.
US Notice of Allowance dated Sep. 19, 2013 issued U.S. Appl. No. 13/242,084.
US Office Action dated Apr. 29, 2013 issued U.S. Appl. No. 13/224,240.
US Final Office Action dated Nov. 22, 2013 issued U.S. Appl. No. 13/224,240.
US Office Action dated Jun. 7, 2013 issued U.S. Appl. No. 13/414,619.
US Notice of Allowance dated Jul. 26, 2013 issued U.S. Appl. No. 13/414,619.
US Office Action dated May 24, 2013 issued U.S. Appl. No. 13/472,282.
US Notice of Allowance dated Oct. 4, 2013 issued U.S. Appl. No. 13/472,282.
PCT International Search Report and Written Opinion, dated Oct. 20, 2011, issued in PCT/US2011/032186.
PCT International Preliminary Report on Patentability, dated Oct. 26, 2012, issued in PCT/US2011/032186.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
PCT International Search Report and Written Opinion dated Dec. 18, 2012, issued in Application No. PCT/US2012/052769.

(56) References Cited

OTHER PUBLICATIONS

PCT International Search Report and Written Opinion dated Feb. 28, 2013, issued in Application No. PCT/US2012/051740.
Korean Notice of Provisional Rejection dated Dec. 6, 2013 issued in KR 10-2012-0043797.
PCT International Search Report and Written Opinion dated May 27, 2013, issued in Application No. PCT/US2013/022977.
Cecchi et al., (2007) "Ultra-thin conformal pore-sealing of low-k materials by plasma-assisted ALD," University of New Mexico, Albuquerque, NM, Sandia National Labs, Albuquerque, NM, 1 page.
Choi, Gyu-Jin et al., (2009) "Plasma-enhanced atomic layer deposition of TiO2 and Al-doped TiO2 films using N2O and O2 reactants," Journal of the Electrochemical Society, 156(9):G138-G143.
Hausmann et al. (2002) "Atomic Layer Deposition of Hafnium and Zirconium Oxides Using Metal Amide Precursors," Chem. Mater. 14(10):4350-4358.
King, Sean W., (Jul./Aug. 2011) "Plasma enhanced atomic layer deposition of SiNx:H and SiO2," J. Vac. Sci. Technol. A29(4):9 pages.
Lee et al., (2005) "Chemically conformal deposition of SrTiO3 thin films by Atomic Layer Deposition using conventional metal organic precursors and remote-plasma activated H2O," School of Materials Science and Engineering, and Inter-university Semiconductor Research Center, Seoul National University, Microelectronic Engineering 80:158-161.
Lee, Jong Ju, (2005) "Low-impurity, highly conformal atomic layer deposition of titanium nitride using NH3-Ar-H2 plasma treatment for capacitor electrodes," Materials Letters, 59:615-617.
Man P.F. et al., (Feb. 11-15, 1996) "Elimination of Post-Release Adhesion in Microstructures Using Conformal Fluorocarbon Coatings," MEMS '96 Proceedings, IEEE, pp. 55-60.
Nguyen, S.V. et al., (Jan./Mar. 1999) "Plasma-assist chemical vapor deposition of dielectric thin films for ULSI semiconductor circuits," IBM J.Res.Develop. 43(1.2):5-38.
Plasma Enhanced Atomic Layer Deposition (PEALD), Website: http://www.asm.com/index.php?option=com_content&task=view&id=19&Itemid=161 (2010), 1 page.
PlasmaProTM, NGP® 80 Range, Next Generation Plasma Systems, Oxford Instruments (2010), 8 pages.
van der Straten et al. (2004) "Atomic layer deposition of tantalum nitride for ultrathin liner applications in advanced copper metallization schemes," Journal of Materials Research, 19(2):447-453.

\* cited by examiner

HIGH GROWTH RATE PROCESS FOR CONFORMAL ALUMINUM NITRIDE

BACKGROUND

Various thin film layers for semiconductor devices may be deposited with atomic layer deposition (ALD) processes. However, existing ALD processes may not be suitable for depositing highly conformal dielectric films. For example, many existing ALD processes cannot offer a combination of high throughput (rapid deposition) and high conformality.

SUMMARY

Provided herein are methods of depositing conformal aluminum nitride and other materials such as other metal nitrides and metal oxides on semiconductor substrates.

One aspect involves a method of processing a semiconductor substrate having features in a reaction chamber. The method includes (a) exposing the substrate to an aluminum-containing precursor for a duration sufficient to substantially adsorb to a surface of the substrate; (b) purging the aluminum-containing precursor from the reaction chamber for a duration insufficient to remove substantially all of the aluminum-containing precursor from the gas phase; (c) exposing the substrate to a nitrogen-containing precursor for a duration sufficient to drive a thermally mediated reaction to form a layer of aluminum nitride on the surface of the substrate, such that the layer of aluminum nitride is substantially conformal to the substrate and has a thickness of about 1.5 Å or greater; (d) purging the nitrogen-containing precursor in gas phase from the reaction chamber; and (e) repeating (a) through (d). In some embodiments, the amount of aluminum nitride deposited during a cycle of (a) through (d) is at least about 2 Å. In some embodiments, the amount of aluminum nitride deposited during a cycle of (a) through (d) is at least about 5 Å. In some embodiments, the layer of aluminum-nitride has step coverage of at least about 80%. In various embodiments, the substrate is processed at a process temperature between about 250° C. and about 450° C. The substrate may be processed at a pressure between about 0.01 Torr and about 10 Torr.

In many embodiments, the aluminum-containing precursor is trimethylaluminum (TMA). In many embodiments, the nitrogen-containing precursor is ammonia ($NH_3$). In some embodiments, nitrogen ($N_2$) is flowed to purge the aluminum-containing precursor and is flowed to purge the nitrogen-containing precursor. In many embodiments, the aluminum-containing precursor is purged for about 2 seconds. In many embodiments, the substrate is exposed to the aluminum-containing precursor for about 7.5 seconds to about 30 seconds. In various embodiments, the ratio of the time the substrate is exposed to the aluminum-containing precursor to the time the aluminum-containing precursor is purged is between about 3.75:1 and about 15:1.

In some embodiments, the features of the substrate have aspect ratios of at least about 2:1. In some embodiments, the features of the substrate have openings of less than about 100 nm. In various embodiments, processing exhibits substantially no pattern loading.

Another aspect involves an apparatus for depositing a film on a substrate surface including a reaction chamber including a pedestal for holding the substrate, at least one outlet for coupling to a vacuum, one or more process gas inlets coupled to two or more precursor sources, and a controller for controlling operations in the apparatus. The controller includes machine-readable instructions for (a) introducing a first precursor into the reaction chamber for a duration sufficient to substantially adsorb the first precursor to the surface of the substrate; (b) purging the chamber for a duration insufficient to remove substantially all of the first precursor from gas phase; (c) introducing a second precursor to the reaction chamber for a duration sufficient to form a layer on the substrate surface, such that the layer is substantially conformal to the substrate and has a thickness of about 1.5 Å or greater; (d) purging the chamber for a duration sufficient to remove the second precursor from gas phase; and (e) repeating (a) through (d).

In some embodiments, the controller includes instructions for performing (a) for a time about 3.75 to about 15 times greater than the time for performing (b). In various embodiments, the instructions for introducing the first precursor include drawing the first precursor from the headspace of a reservoir of the first precursor to the chamber. In some embodiments, the instructions for introducing the first precursor also includes flowing a carrier gas with the first precursor downstream from the drawing of the first precursor from the headspace and upstream from the reaction chamber.

These and other aspects are described further below with reference to the drawings.

DETAILED DESCRIPTION

Figure 1:
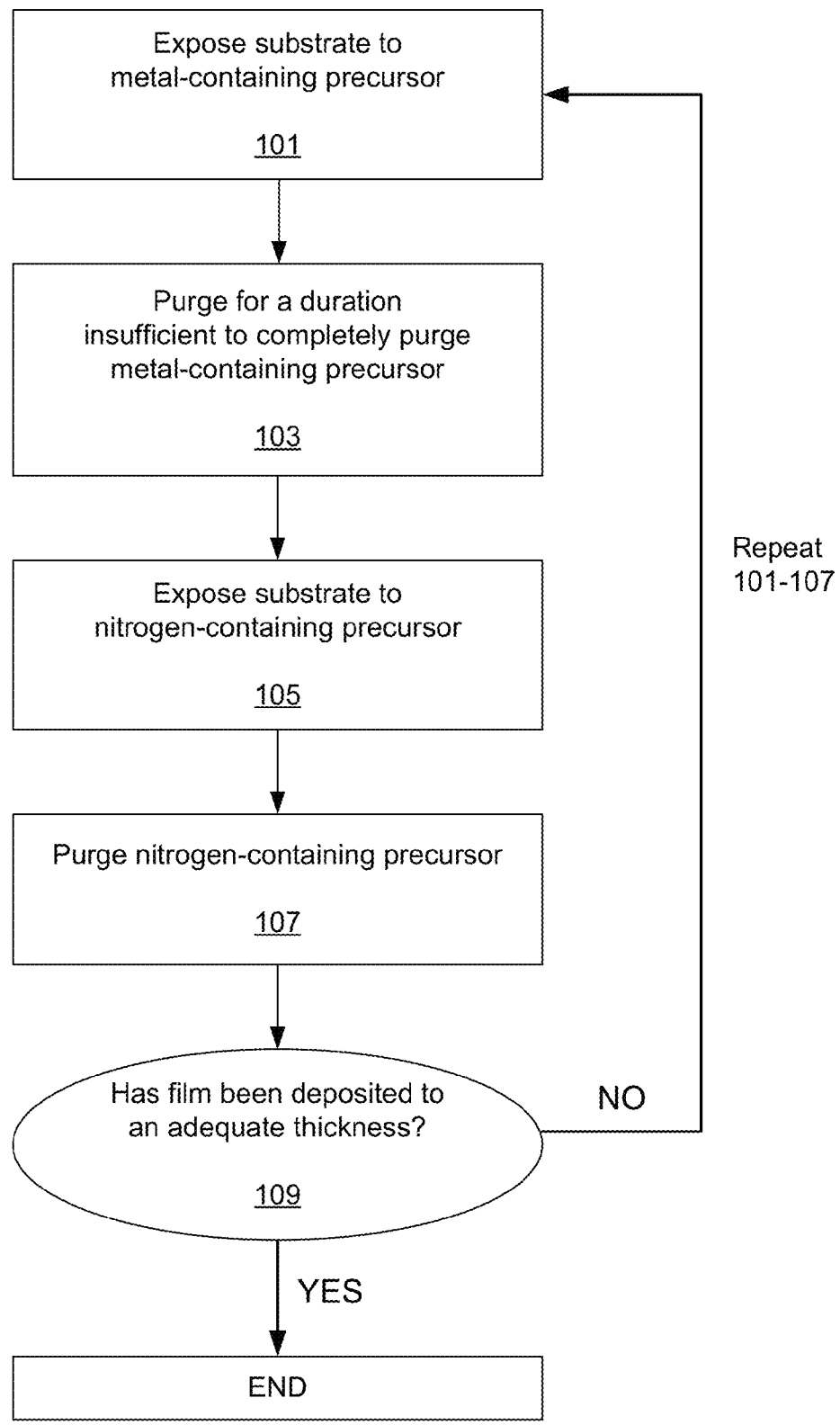
FIG. 1 is a process flow diagram of a method of depositing aluminum nitride in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Manufacture of semiconductor devices typically involves depositing one or more thin films on a non-planar structure in an integrated fabrication process. In some aspects of the integrated process, it may be useful to deposit thin films that conform to substrate topography. For example, some front-end-of-the-line processes may involve deposition of conformal films. Example substrates may include substrates with features having aspect ratios of at least about 2:1, or at least about 4:1, or at least about 6:1, or at least about 10:1. Examples of conformal films for front-end-of-line processes include hard masks, etch stops, and encapsulation layers. Front-end-of-line structures fabricated using such films include transistors (e.g., FinFETs) and metal-containing memory devices.

Atomic layer deposition (ALD) processes use surface-mediated deposition reactions to deposit films on a layer-by-layer basis. In one example of an ALD process, a substrate surface, including a population of surface active sites, is exposed to a gas phase distribution of a first precursor in a dose. Some molecules of this first precursor may form a condensed phase atop the substrate surface, including chemisorbed species and/or physisorbed molecules of the first precursor. The reactor is then evacuated to remove gas phase first precursor so that only adsorbed species remain. A second precursor may then be introduced to the reactor so that some of these molecules adsorb to the substrate surface. The reactor may then be evacuated again to remove unbound second precursor molecules. Thermal energy may activate surface reactions between the first and second precursors to form a film layer. In some processes, the second precursor reacts immediately with the adsorbed first precursor. In other embodiments, the second precursor reacts only after a source of activation is applied temporally. Additional ALD cycles may be used to build film thickness.

Conventional ALD processes such as the one described above form highly conformal films. Conformality of films is often measured by the step coverage. Step coverage may be calculated by comparing the average thickness of a deposited film on a bottom, sidewall, or top of a feature to the average thickness of a deposited film on a bottom, sidewall, or top of a feature. For example, step coverage may be calculated by dividing the average thickness of the deposited film on the sidewall by the average thickness of the deposited film at the top of the feature and multiplying it by 100 to obtain a percentage. Conventional ALD processes may deposit films with near 100% step coverage.

However, although deposited films are highly conformal, conventional ALD processes exhibit low deposition growth rate, such as, for example, between about 0.7 Å and 1.0 Å per cycle for deposition of aluminum nitride, or less than a monolayer deposited per cycle. A lower growth rate results in lower production efficiency and thus lower throughput.

Higher deposition growth rates are observed with chemical vapor deposition (CVD) and physical vapor deposition (PVD). However, in these processes, deposited films have low conformity with step coverage between about 50% and about 70%. Thus, existing processes fail to deposit conformal films that have both high growth rate and high conformality.

Provided herein are methods of depositing highly conformal thin films at a high growth rate. Methods involve a modified ALD method that combines CVD-like reactions with ALD surface reactions. CVD-like conditions are promoted with no significant loss of conformality. Methods may involve low purge to dose ratios and formation of the deposited film is driven largely on a thermal-mediated reaction and not a plasma-activated reaction. Deposited films may exhibit high growth rates about 4 to about 7 times greater than conventional ALD methods, which increases throughput and decreases cost of processing substrates. Methods also exhibit highly conformal deposited films, significantly greater than 70%, such as about 100% step coverage.

These methods may be performed to deposit films suitable for use as a conformal hardmask, an etch stop film, an encapsulation film, or one or more layers of a stack such as a gate, a memory stack (e.g., a magnetic RAM stack), or other suitable semiconductor device structures. In some cases, the deposited film encapsulates a gate structure including a gate electrode and/or gate dielectric. In some embodiments, the deposited film encapsulates a magnetic memory stack. Disclosed methods may be performed on substrates having "features" such as via or contact holes, which may be characterized by one or more of narrow and/or re-entrant openings, constrictions within the feature, and high aspect ratios. One example of a feature is a hole or via in a semiconductor substrate or a layer on the substrate. Another example is a trench in a substrate or layer. The substrate may be a silicon wafer, e.g., a 200-mm wafer, a 300-mm wafer, or a 450-mm wafer, including wafers having one or more layers of material, such as dielectric, conducting, or semi-conducting material deposited thereon. The feature may be formed in one or more of these layers. In some embodiments, the feature may have an aspect ratio of at least about 2:1, at least about 4:1, at least about 6:1, at least about 10:1, or higher. The feature may also have a dimension near the opening, e.g., an opening diameter or line width of between about 10 nm to 500 nm, for example between about 25 nm and about 300 nm. Disclosed methods may be performed on substrates with features having an opening less than about 150 nm. A feature via or trench may be referred to as an unfilled feature or a feature.

A feature that may have a re-entrant profile that narrows from the bottom, closed end, or interior of the feature to the feature opening. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers. In certain embodiments, the under-layer may be titanium nitride (TiN), titanium metal (Ti), tungsten nitride (WN), titanium aluminide (TiAl), or a titanium oxide ($TiO_x$). In various embodiments, the under-layer may be a dielectric layer, such as an oxide or nitride or oxynitride. Examples of dielectric layers include silicon oxide, silicon nitride, silicon oxynitride, and others.

In many embodiments, the methods disclosed may be performed at a temperature between about 250° C. and about 450° C., or about 350° C. to about 400° C. In general, a higher deposition temperature results in a higher deposition rate. In various embodiments, the methods may be performed at a pressure of between about 0.01 Torr and about 10 Torr, or at a pressure of between about 0.1 Torr and about 1 Torr. A higher pressure results in a larger amount of reactant present in the deposition space, which may thereby increase the deposition rate. The methods described are dominantly driven by a thermal reaction process. In the following example, flow rates are provided for a 180 L chamber. In some cases, depending on the reactor configuration, the flow rates may be scaled to accommodate different volumes.

FIG. 1 is a process flow diagram of a method of depositing a thin conformal film in accordance with a certain embodiment. Note that the following chemistry presented is an example only to illustrate the disclosed embodiments. A substrate to be processed may be in a deposition chamber or deposition station. In operation 101, a substrate is exposed to a first precursor—for example, an aluminum-containing precursor such as an organo-aluminum compound. In some embodiments, the aluminum-containing precursor is an alkyl-aluminum compound such as trimethylaluminum (TMA), or dimethylaluminum hydride. In some embodiments, the aluminum-containing precursor is an aluminum acetate, alkoxide, or aluminum halide. In many embodiments, the exposure time or duration is sufficient to form a substantially complete saturation or adsorption layer on the surface of the substrate. In certain embodiments, exposure time for this dose may be between about 5 seconds and about 60 seconds, e.g., between about 7.5 seconds and about 30 seconds. In certain embodiments, the flow rate of TMA may range from about 10 sccm to about 350 sccm. The process of contacting the substrate with reactant (e.g., aluminum-containing precursor) is sometimes referred to as "dosing."

In some embodiments, operation 101 may be performed by drawing TMA directly from the headspace of a source of TMA, which may be a reservoir of TMA, through a line connected to the deposition chamber where the substrate is located.

In some embodiments, operation 101 may be performed by inletting TMA from the headspace using a carrier gas introduced downstream of the TMA source into the chamber through the showerhead. The carrier gas may be downstream of the TMA source and upstream of the chamber or showerhead. In many embodiments, the carrier gas is an inert gas. In some embodiments, the carrier gas may be nitrogen ($N_2$), argon (Ar), hydrogen ($H_2$), or helium (He). In some embodiments, the flow rate of the carrier gas may be between about 50 sccm and about 1000 sccm. When a carrier gas is used to expose the substrate to TMA, the overall flow rate of TMA may be higher, such as between about 10 sccm and about 200 sccm of pure TMA vapor for a carrier gas flow between about 150 sccm and about 950 sccm. In some embodiments, the overall flow rate of TMA may be lower.

In operation 103, the chamber or station is purged for a duration insufficient to completely purge the aluminum-containing precursor in the gas phase. In many embodiments, the chamber or station is purged by flowing a purge gas, such as, for example, nitrogen ($N_2$). In certain embodiments, the flow rate of the purge gas is between about 15 sccm and about 500 sccm. The purge gas is introduced after the flow of the first precursor is stopped. The purge time or duration of purge may be insufficient to completely purge the aluminum-containing precursor in the gas phase such that there is both surface adsorption from operation 101 as well as residual aluminum-containing precursor in the gas phase in the reaction space not on the surface of the substrate or loosely adhered to the substrate. In many embodiments, the purge time to dose time ratio, such as the operation 103 to operation 101 time ratio for example, may be between about 3:1 and about 20:1, e.g., between about 3.75:1 and about 15:1. In some embodiments, the purge time is less than about 5 seconds, e.g., between about 0.1 second and about 5 seconds, or about 2 seconds. In some embodiments, the purge in operation 103 may be accomplished by evacuating the reaction chamber.

In operation 105, the substrate is exposed to a second precursor, or as an example, a nitrogen-containing precursor, for a duration sufficient to form a layer of, e.g., aluminum nitride by a thermal reaction on the surface of the substrate. In certain embodiments, the nitrogen-containing precursor is ammonia ($NH_3$). In many embodiments, the substrate is exposed to the nitrogen-containing precursor for a time between about 1 second and about 60 seconds, or about 2.5 seconds, or about 30 seconds. In various embodiments, the resulting aluminum nitride layer has a thickness about 1.5 Å or greater, typically greater than 3 Å/cycle. In some embodiments, the flow rate of the nitrogen-containing precursor may be between about 0.1 slm and about 20 slm (e.g., between about 1 slm and about 10 slm). In some embodiments, a carrier gas may be used during the exposure to the nitrogen-containing precursor. An example of a suitable carrier gas is nitrogen ($N_2$), and if nitrogen is used as a carrier gas and co-flowed with the nitrogen-containing precursor, the nitrogen may be flowed at a flow rate between about 500 sccm and 10 slm.

In operation 105, the primary reaction is an ALD reaction on the surface such that surface-diffusion dominated kinetics occur to create a conformal aluminum nitride layer. Without being bound by a particular theory, at the same time, reactions in the gas phase, or gas-phase nucleation, occurs due to a CVD-like reaction that occurs between the residual aluminum-containing precursor remaining in gas phase after the purge in operation 103 and the nitrogen-containing precursor entering the reaction space. This may contribute to the increased growth rate in the thin, conformal film. The strong contribution of surface-diffusion dominated kinetics (associated with ALD) ensures preservation of conformality.

In operation 107, the nitrogen-containing precursor is purged. In many embodiments, purging includes flowing a purge gas, such as, for example, nitrogen ($N_2$). In some embodiments, the purge gas is flowed between about 5 seconds to about 10 seconds, or about 6 seconds at a flow rate between about 0 sccm and about 10,000 sccm. This purge may be sufficient to remove substantially all of the remaining nitrogen-containing precursor in gas phase from the reaction space, or station, or chamber.

In operation 109, workflow determines if the film has been deposited to an adequate thickness, and if so, then the method of depositing the film is complete. If the film has not yet been deposited to an adequate thickness, operations 101 through 107 are repeated until the film has been deposited to an adequate thickness.

The concept of a "cycle" is relevant to the discussion of various embodiments herein. Generally a cycle is the minimum set of operations required to perform a surface deposition reaction one time. The result of one cycle is production of at least a partial film layer on a substrate surface. Typically, a cycle will include only those steps necessary to deliver and adsorb each reactant to the substrate surface, and then react those adsorbed reactants to form the partial layer of film. Of course, the cycle may include certain ancillary steps such as sweeping one of the reactants or byproducts and/or treating the partial film as deposited. Generally, a cycle contains only one instance of a unique sequence of operations. As an example, a cycle may include the following operations: (i) delivery/adsorption of reactant A, (ii) sweep a portion of A out of the reaction chamber, (iii) delivery/adsorption of reactant B under conditions sufficient to drive a reaction of A and B to form the partial film layer on the surface, and (iv) sweep B out of the reaction chamber.

Figure 2:
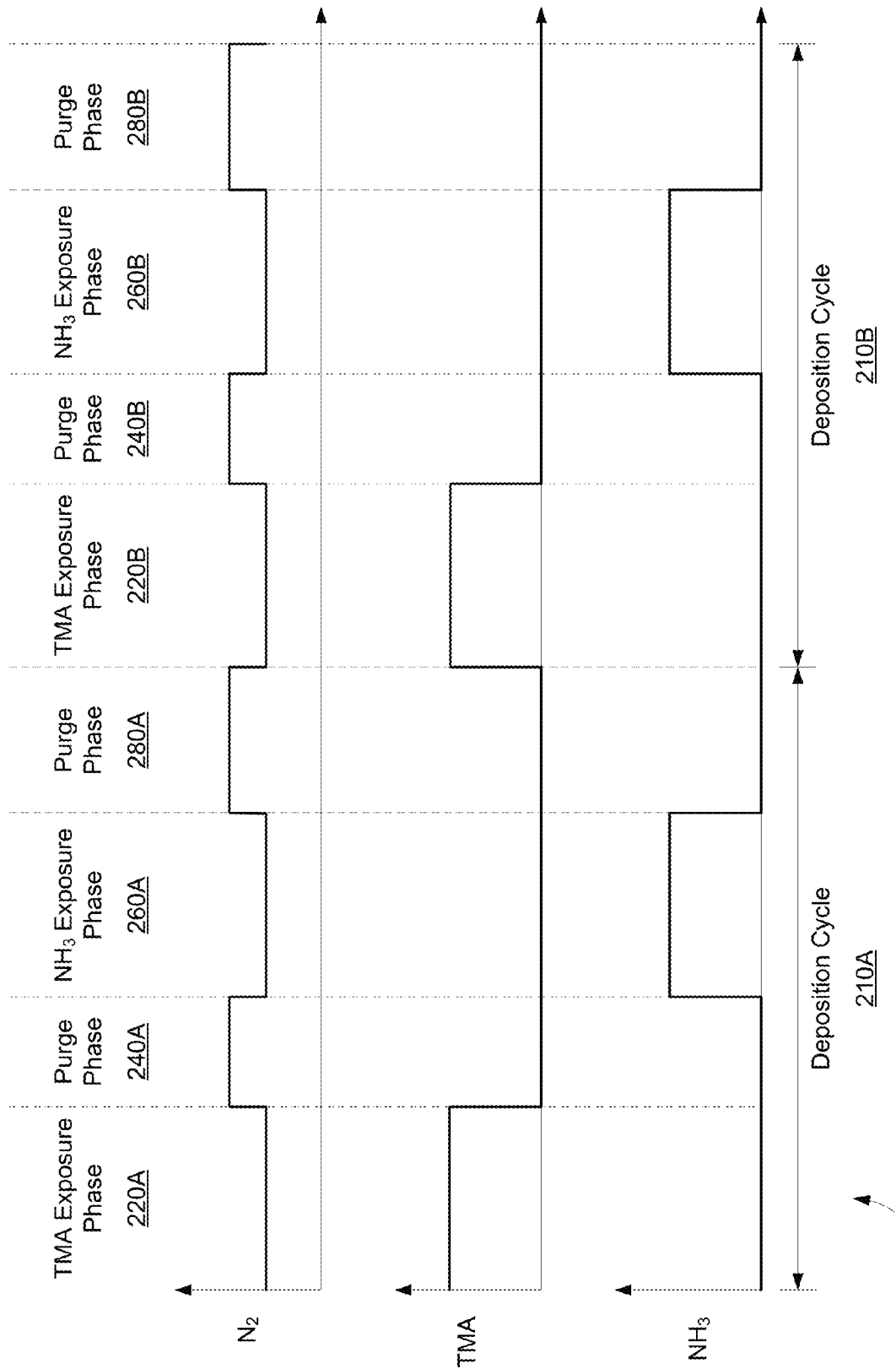
FIG. 2 is a timing sequence diagram of pulses in accordance with disclosed embodiments.

Two deposition cycles of performing the method shown in FIG. 1 are depicted in the timing sequence 200 in FIG. 2. In this sequence, a deposition cycle as shown in 210A and 210B includes exposure of a first precursor, a purge, exposure of a second precursor, and another purge. As shown, phases of exposure and purges occur from left to right in the timing scheme, and whether a gas is flowed or not is depicted by the lines on the sequence.

As an example, nitrogen ($N_2$) is flowed during the purge phase 240A and 280A in the deposition cycle 210A, which corresponds with performing operation 103 and 107 in FIG. 1, respectively. Nitrogen is also flowed during purge phase 240B and 280B in the deposition cycle 210B, which corresponds with repeating operation 103 and 107 in FIG. 1, respectively. As an example, TMA is shown as a gas flowed during the first precursor or TMA exposure phase 220A in the deposition cycle 210A, which corresponds with performing operation 101 in FIG. 1. TMA is also flowed during TMA exposure phase 220B in the deposition cycle 210B, which corresponds with repeating operation 101 in FIG. 1. Nitrogen or other carrier gas may be flowed together with the TMA, as illustrated in FIG. 2. As an example, ammonia is shown as a gas flowed during the second precursor or ammonia exposure phase 260A in the deposition cycle 210A, which corresponds with performing operation 105 in FIG. 1. Ammonia is also flowed during ammonia exposure phase 260B in the deposition cycle 210B, which corresponds with repeating operation 105 in FIG. 1. It is noted here that after the first deposition cycle 210A, the response to operation 109 in FIG. 1 is that the film has not been deposited to an adequate thickness, and thus operations 101 through 107 are repeated in the second deposition cycle 210B.

For example, a "recipe" or single deposition cycle sequence may begin with exposure of TMA at a flow rate between about 10 sccm and 350 sccm with $N_2$ as a carrier gas flowed between about 15 sccm and 500 sccm for between about 7.5 seconds and about 30 seconds. Next, TMA flow may be turned off and nitrogen may continue to flow as a purge gas at a flow rate between about 0 sccm and about 10,000 sccm for about 2 seconds. Ammonia ($NH_3$) flow may then be turned on for ammonia exposure at a flow rate between about 1 slm and 10 slm with nitrogen as a carrier gas flowed between about 500 sccm and 10 slm for 30 seconds. Ammonia may then react with adsorbed and gas phase TMA to form an aluminum nitride film. Ammonia flow may then be turned off and nitrogen may continue to flow as a purge gas for about 6 seconds at a flow rate between about 0 sccm and about 10,000 sccm. This example deposition cycle may be performed at a pressure of about 0.1 Torr at a temperature between about 350° C. and about 400° C. A deposition cycle such as the one given here as an example may be repeated until the desired thickness of the film is deposited. For example, the aluminum nitride film may be deposited at a deposition rate of between about 2.5 Å and about 8 Å per cycle. The resulting aluminum nitride film may have step coverage of at least about 90% or about 100% and may depend on the number of deposition cycles performed.

Films deposited by methods disclosed herein may result in deposition rate or growth rate of about 1.5 Å to about 10 Å per cycle, or 2 Å to about 5 Å per cycle. In many embodiments, films deposited are highly conformal and exhibit step coverage at least about 80%, or at least about 90%, or at least about 99%, or about 100%. These levels of conformality and deposition rate are exhibited in features having high aspect ratios (e.g., about 1:2 or greater or about 1:6 or greater) and small size (e.g., openings of about 100 nm or smaller or about 60 nm or smaller). In many embodiments, the films deposited by methods disclosed herein result in little or no pattern loading, where pattern loading or "microloading" is defined as the tendency of a film to deposit differently the same wafer with different aspect ratios and different areal structure densities for the same deposition conditions.

In some embodiments, a plasma may be used. In embodiments where a plasma is used, the method may include (1) exposing a substrate to a metal-containing precursor (e.g., aluminum-containing precursor) for a duration sufficient to adsorb onto the surface of the substrate, (2) purging the metal-containing precursor for a duration insufficient to remove substantially all of the metal-containing precursor in gas phase, (3) exposing the substrate to a nitrogen- or oxygen-containing precursor while initiating a plasma to form a metal nitride or metal oxide film on the substrate, (4) purging the nitrogen-containing precursor from the gas phase, and (5) repeating (1) through (4). In certain embodiments, the metal-containing precursor is TMA. In some embodiments, the purging is performed by flowing a purge gas, such as, for example, nitrogen. In certain embodiments the nitrogen-containing precursor is ammonia. In many embodiments, radio frequency (RF) power of the plasma may be between about 13.56 MHz and about 40 MHz. For a 300 mm wafer, the RF power may range from about 0 kW per station to about 2.5 kW per station. In many embodiments, the plasma has a RF power density of between about 0 Watts/cm$^2$ and about 3.54 Watts/cm$^2$ of substrate. Examples of using a plasma in conformal film deposition (CFD) processes are provided in U.S. patent application Ser. No. 13/084,399, filed Apr. 11, 2011, and U.S. patent application Ser. No. 13/224,240, filed Sep. 1, 2011, which are incorporated herein by reference in their entireties.

The method shown in FIG. 1 may be practiced using other chemistries. Examples of a first precursor in operation 101 include metal-containing compounds such as aluminum-containing precursors such as an alkyl-aluminum compound such as trimethylaluminum (TMA), or dimethylaluminum hydride. In some embodiments, the aluminum-containing precursor is an aluminum acetate, alkoxide, or aluminum halide. In general, the metal containing precursors include organometallic compounds such as alkyl metal compounds as well as metal halides having a high vapor pressure under deposition conditions. Such compounds exist in a vapor state and are readily delivered to the substrate and adsorb thereon. Some methods described herein may be suitable for thermal ALD involving organometallic or halide precursors and ammonia/water ($NH_3/H_2O$) or ozone ($O_3$) as half reactants for a variety of metal systems. Examples of metal systems include titanium (Ti), hafnium (Hf), zirconium (Zr), manganese (Mn), tungsten (W), and tantalum (Ta). Examples of purge gases used in operations 103 and 107 include nitrogen ($N_2$), argon (Ar), helium (He), hydrogen ($H_2$), oxygen ($O_2$), and others. Examples of a second precursor in operation 105 include nitrogen-containing precursors, such as ammonia ($NH_3$), or tertbutylamine (TBA). Other examples of the second precursor include oxygen-containing precursors such as ozone ($O_3$), water vapor ($H_2O$), methanol ($CH_4O$), ethanol ($C_2H_6O$), peroxides, and others. Examples of carrier gases that may flow with a precursor gas include argon (Ar), helium (He), and nitrogen ($N_2$).

Apparatus

Figure 3A:
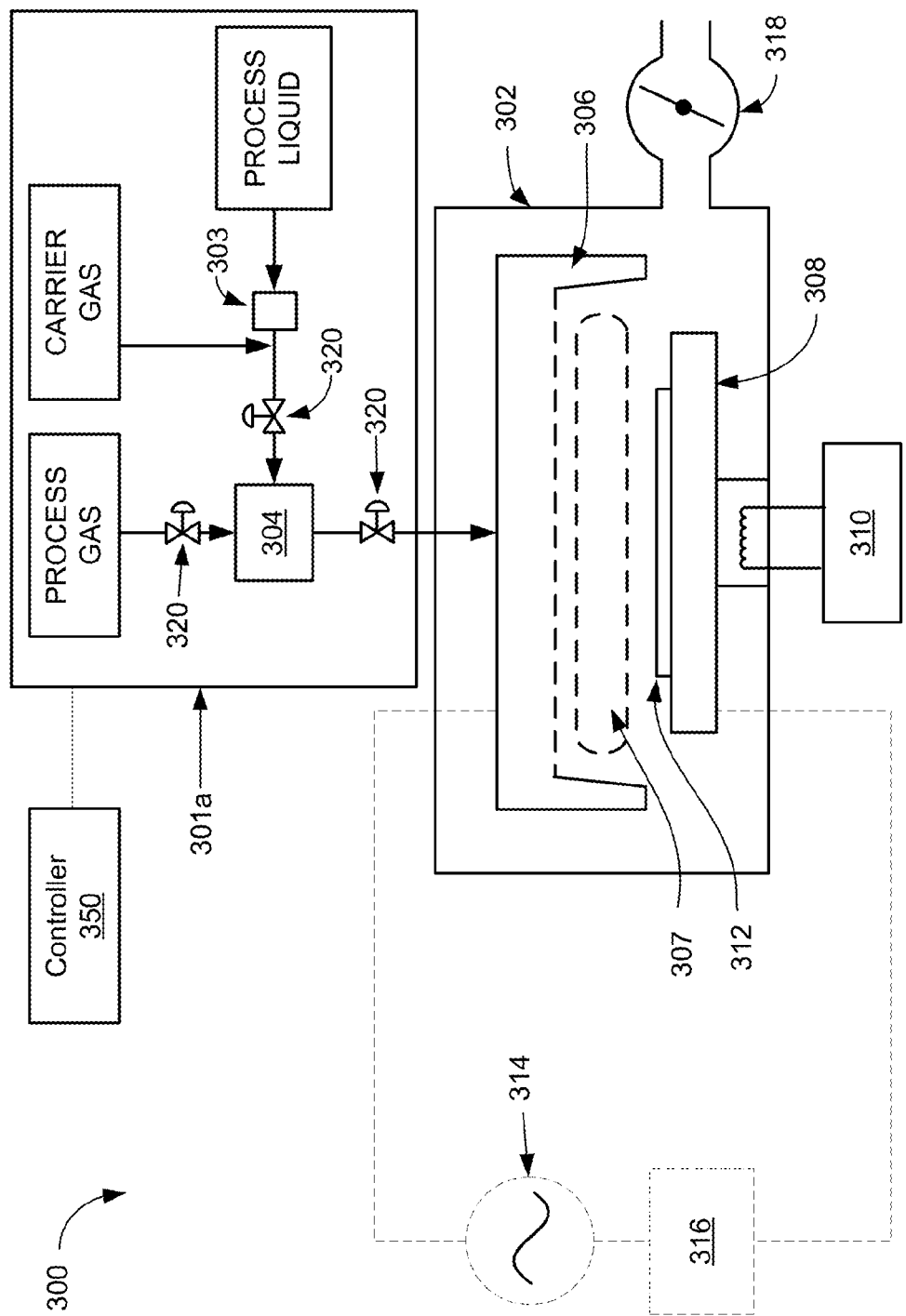
FIGS. 3A and 3B are schematic illustrations of examples of a chamber for practicing various embodiments.
Figure 4:
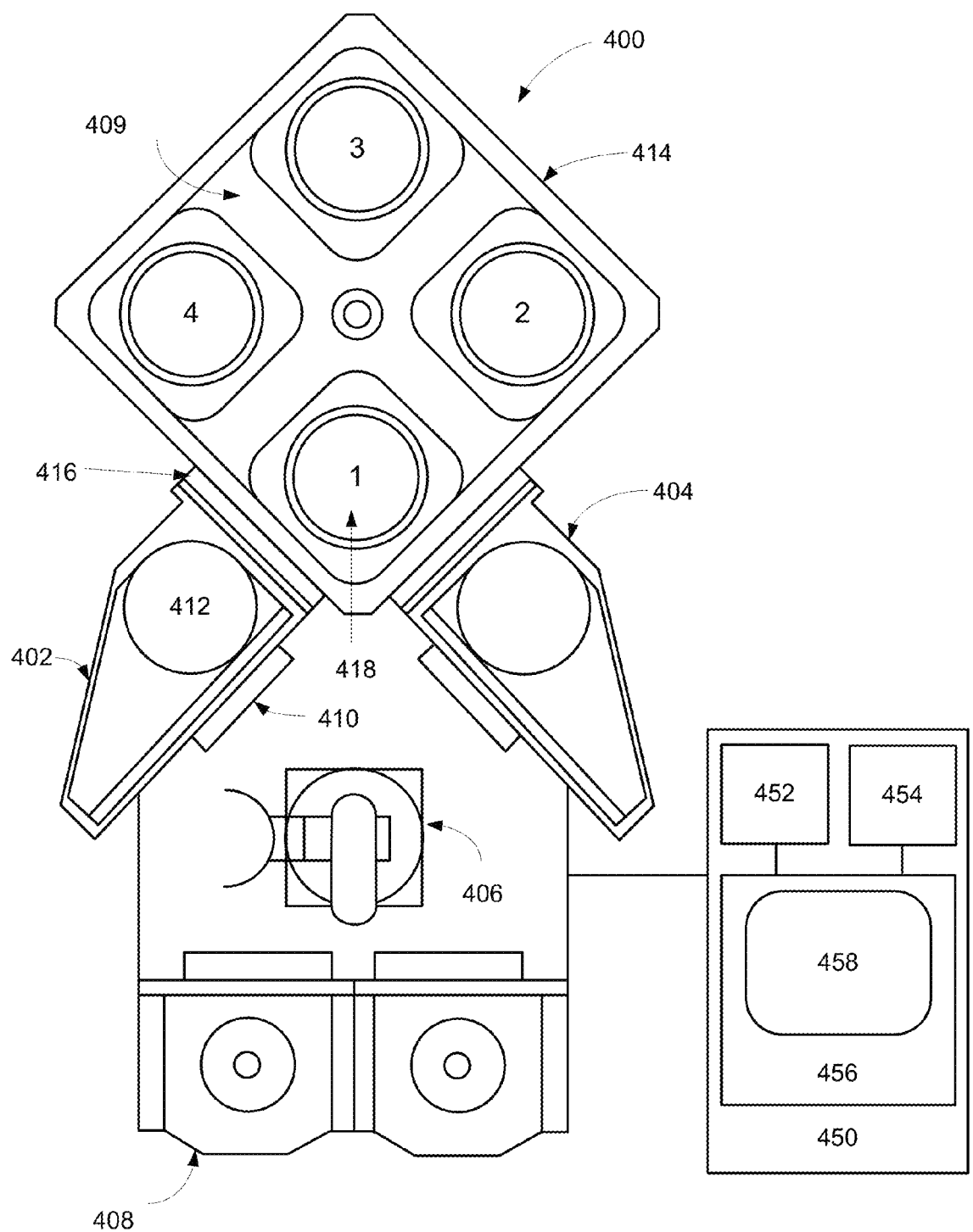
FIG. 4 is a schematic illustration of an example of an apparatus for practicing various embodiments.

FIG. 3A depicts a schematic illustration of an embodiment of an atomic layer deposition (ALD) process station 300 having a process chamber body 302 for maintaining a low-pressure environment. A plurality of ALD process stations 300 may be included in a common low pressure process tool environment. For example, FIG. 4 depicts an embodiment of a multi-station processing tool 400. In some embodiments, one or more hardware parameters of ALD process station 300, including those discussed in detail below, may be adjusted programmatically by one or more computer controllers 350.

ALD process station 300 fluidly communicates with reactant delivery system 301a for delivering process gases to a distribution showerhead 306. Reactant delivery system 301a includes a mixing vessel 304 for blending and/or conditioning process gases for delivery to showerhead 306. One or more mixing vessel inlet valves 320 may control introduction of process gases to mixing vessel 304.

Figure 3B:
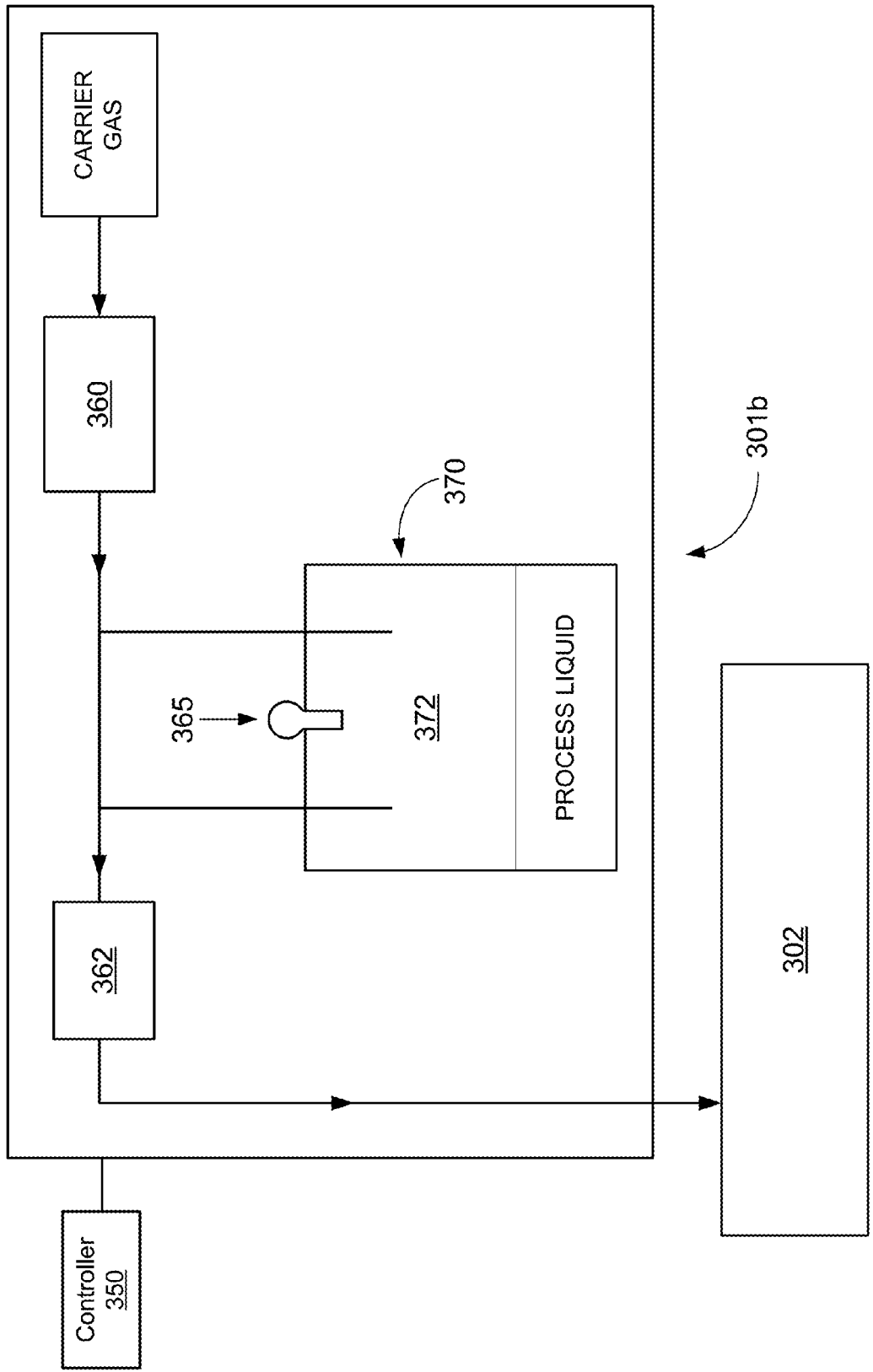

FIG. 3B depicts a schematic illustration of an alternative reactant delivery system 301b for delivering reactants to the showerhead 306. Some reactants, such as trimethylaluminum (TMA), may be stored in liquid form prior to vaporization at and subsequent delivery to the process chamber body 302. In FIG. 3B, vapor of the process liquid contained in reservoir 370 may be drawn from the headspace 372 to a restrictor 362, which may deliver reactants with the carrier gas to process chamber body 302. The reservoir may include a gauge 365. In some embodiments, a carrier gas may be upstream of the process liquid reservoir 370 such that the carrier gas pushes the vapor of the process liquid in reservoir 370 initially drawn from the headspace 372 through conduits to the restrictor 362 and subsequently to the chamber body 302. In many embodiments, the carrier gas may first flow through a mass flow controller 360 before carrying vapor from headspace 372 to the restrictor 362. In these embodiments where a carrier gas is used to push the vapor, the flow rate of the vapor into the chamber 302 may be higher than in embodiments where a carrier gas is not used and the vapor is drawn directly from the headspace 372, to the mixing vessel 304, and to the chamber body 302.

As an example, the embodiment of FIG. 3A includes a vaporization point 303 for vaporizing liquid reactant to be supplied to the mixing vessel 304. In some embodiments, vaporization point 303 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 303 may be heat traced. In some examples, mixing vessel 304 may also be heat traced. In one non-limiting example, piping downstream of vaporization point 303 has an increasing temperature profile extending from approximately 100° C. to approximately 150° C. at mixing vessel 304.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 303. In one scenario, a liquid injector may be mounted directly to mixing vessel 304. In another scenario, a liquid injector may be mounted directly to showerhead 306.

In some embodiments, a liquid flow controller (LFC) upstream of vaporization point 303 may be provided for controlling a mass flow of liquid for vaporization and delivery to process station 300. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 306 distributes process gases toward substrate 312. In the embodiment shown in FIG. 3A, the substrate 312 is located beneath showerhead 306 and is shown resting on a pedestal 308. Showerhead 306 may have any suitable shape, and may have any suitable number and arrangement of ports for distributing process gases to substrate 312.

In some embodiments, a microvolume 307 is located beneath showerhead 306. Practicing disclosed embodiments in a microvolume rather than in the entire volume of a process station may reduce reactant exposure and purge times, may reduce times for altering process conditions (e.g., pressure, temperature, etc.) and may limit an exposure of process station robotics to process gases, etc. Example microvolume sizes include, but are not limited to, volumes between 0.1 liter and 2 liters. This also impacts productivity throughput. In some embodiments, the disclosed embodiments are not performed in a microvolume.

In some embodiments, pedestal 308 may be raised or lowered to expose substrate 312 to microvolume 307 and/or to vary a volume of microvolume 307. For example, in a substrate transfer phase, pedestal 308 may be raised to position substrate 312 within microvolume 307. In some embodiments, microvolume 307 may completely enclose substrate 312 as well as a portion of pedestal 308 to create a region of high flow impedance.

Optionally, pedestal 308 may be lowered and/or raised during portions the process to modulate process pressure, reactant concentration, etc., within microvolume 307. In one scenario where process chamber body 302 remains at a base pressure during the process, lowering pedestal 308 may allow microvolume 307 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller 350.

In another scenario, adjusting a height of pedestal 308 may allow a plasma density to be varied during plasma activation and/or treatment cycles included in the process. At the conclusion of the process phase, pedestal 308 may be lowered during another substrate transfer phase to allow removal of substrate 312 from pedestal 308.

While the example microvolume variations described herein refer to a height-adjustable pedestal, it will be appreciated that, in some embodiments, a position of showerhead 306 may be adjusted relative to pedestal 308 to vary a volume of microvolume 307. Further, it will be appreciated that a vertical position of pedestal 308 and/or showerhead 306 may be varied by any suitable mechanism within the scope of the present disclosure. In some embodiments, pedestal 308 may include a rotational axis for rotating an orientation of substrate 312. It will be appreciated that, in some embodiments, one or more of these example adjustments may be performed programmatically by one or more suitable computer controllers 350.

In some embodiments where plasma may be used as discussed above, showerhead 306 and pedestal 308 electrically communicate with a radio frequency (RF) power supply 314 and matching network 316 for powering a plasma. In some embodiments, the plasma energy may be controlled by controlling one or more of a process station pressure, a gas concentration, an RF source power, an RF source frequency, and a plasma power pulse timing. For example, RF power supply 314 and matching network 316 may be operated at any suitable power to form a plasma having a desired composition of radical species. Examples of suitable powers are included above. Likewise, RF power supply 314 may provide RF power of any suitable frequency. In some embodiments, RF power supply 314 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 350 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as TMA), instructions for setting a flow rate of a carrier gas (such as nitrogen), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for setting a flow rate of an inert and/or reactant gas which may be the same as or different from the gas used in the first recipe phase (e.g., the second precursor such as ammonia), instructions for modulating a flow rate of a carrier gas, and time delay instructions for the third recipe phase. A fourth recipe phase may include instructions for modulating or stopping a flow rate of an inert and/or a reactant gas, instructions for modulating the flow rate of a carrier or purge gas, and time delay instructions for the fourth recipe phase. It will be appreciated that these recipe phases may be further subdivided and/or iterated in any suitable way within the scope of the present disclosure.

In some embodiments, pedestal 308 may be temperature controlled via heater 310. Further, in some embodiments, pressure control for process station 300 may be provided by butterfly valve 318. As shown in the embodiment of FIG. 3, butterfly valve 318 throttles a vacuum provided by a downstream vacuum pump (not shown). However, in some embodiments, pressure control of process station 300 may also be adjusted by varying a flow rate of one or more gases introduced to the process station 300.

As described above, one or more process stations may be included in a multi-station processing tool. FIG. 4 shows a schematic view of an embodiment of a multi-station processing tool 400 with an inbound load lock 402 and an outbound load lock 404, either or both of which may comprise a remote plasma source. A robot 406, at atmospheric pressure, is configured to move wafers from a cassette loaded through a pod 408 into inbound load lock 402 via an atmospheric port 410. A wafer is placed by the robot 406 on a pedestal 412 in the inbound load lock 402, the atmospheric port 410 is closed, and the load lock is pumped down. Where the inbound load lock 402 comprises a remote plasma source, the wafer may be exposed to a remote plasma treatment in the load lock prior to being introduced into a processing chamber 414. Further, the wafer also may be heated in the inbound load lock 402 as well, for example, to remove moisture and adsorbed gases. Next, a chamber transport port 416 to processing chamber 414 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 414 comprises four process stations, numbered from 1 to 4 in the embodiment shown in FIG. 4. Each station has a heated pedestal (shown at 418 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 414 may include one or more matched pairs of ALD and plasma-enhanced ALD process stations. While the depicted processing chamber 414 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 4 depicts an embodiment of a wafer handling system 490 for transferring wafers within processing chamber 414. In some embodiments, wafer handling system 490 may transfer wafers between various process stations and/or between a process station and a load lock. It will be appreciated that any suitable wafer handling system may be employed. Non-limiting examples include wafer carousels and wafer handling robots. FIG. 4 also depicts an embodiment of a system controller 450 employed to control process conditions and hardware states of process tool 400. System controller 450 may include one or more memory devices 456, one or more mass storage devices 454, and one or more processors 452. Processor 452 may include a CPU or computer, analog and/or digital input/output connections, stepper motor controller boards, etc.

In some embodiments, system controller 450 controls all of the activities of process tool 400. System controller 450 executes system control software 458 stored in mass storage device 454, loaded into memory device 456, and executed on processor 452. Alternatively, the control logic may be hard coded in the controller 450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 458 may include instructions for controlling the timing, mixture of gases, amount of sub-saturated gas flow, chamber and/or station pressure, chamber and/or station temperature, wafer temperature, target power levels, RF power levels, substrate pedestal, chuck and/or susceptor position, and other parameters of a particular process performed by process tool 400. System control software 458 may be configured in any suitable way. For example, various process tool component subroutines or control objects may be written to control operation of the process tool components necessary to carry out various process tool processes. System control software 458 may be coded in any suitable computer readable programming language.

In some embodiments, system control software 458 may include input/output control (IOC) sequencing instructions for controlling the various parameters described above. Other computer software and/or programs stored on mass storage device 454 and/or memory device 456 associated with system controller 450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 418 and to control the spacing between the substrate and other parts of process tool 400.

A process gas control program may include code for controlling gas composition (e.g., TMA, ammonia, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 450. The user interface may include a display screen, graphical software displays of the apparatus and/or process conditions, and user input devices such as pointing devices, keyboards, touch screens, microphones, etc.

In some embodiments, parameters adjusted by system controller 450 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 450 from various process tool sensors. The signals for controlling the process may be output on the analog and digital output connections of process tool 400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 450 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

An appropriate apparatus for performing the methods disclosed herein is further discussed and described in U.S. patent application Ser. No. 13/084,399, filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted to evaluate step coverage of features deposited using methods of the disclosed embodiments. In this experiment, an aluminum nitride layer was deposited on a metal dielectric substrate with features at 350° C. and 0.1 Torr using cycles of a 7.5-second exposure of trimethylaluminum (TMA), a 2-second purge, a 30-second exposure of ammonia ($NH_3$), and a 6-second purge. The reaction was entirely thermal and no plasma was initiated.

The results of the measurements and calculations of step coverage are shown in Table 1 below.

TABLE 1

| | | Step Coverage | | |
|---|---|---|---|---|
| Sidewall (avg, nm) | Top (avg, nm) | Bottom (avg, nm) | Step Coverage Sidewall/Top (%) | Step Coverage Sidewall/Bottom (%) |
| 20.09 | 19.97 | 19.43 | 100.6% | 102.8% |

Figure 5:
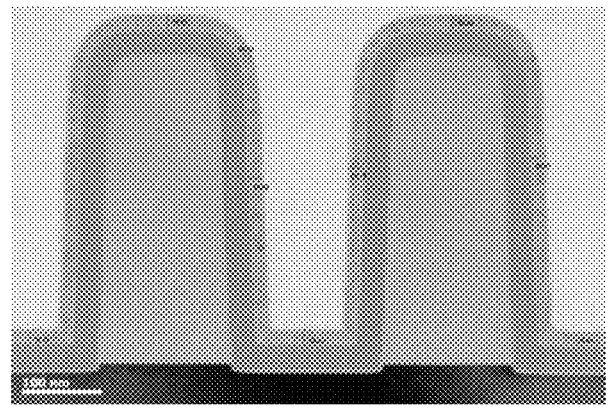
FIGS. 5, 6A, 6B, and 7 are images of deposited films in accordance with experiments of the disclosed embodiments.

FIG. 5 is an image of the deposited aluminum nitride film on the substrate. The average deposition rate of aluminum nitride was about 3.3 Å per cycle and 100% conformality was achieved.

Experiment 2

An experiment was conducted to evaluate whether there was pattern loading as a result of practicing the disclosed embodiments. In this experiment, an aluminum nitride layer was deposited on a metal dielectric substrate with features at 350° C. and 0.1 Torr using cycles of a 7.5-second exposure of trimethylaluminum (TMA), a 2-second purge, a 30-second exposure of ammonia (NH$_3$), and a 6-second purge. The reaction was entirely thermal and no plasma was initiated. Experiments were conducted on substrates with an aspect ratio of 2.5:1 and 6:1, and a field or blanket substrate. The results of the measurements and calculations of step coverage are shown in Table 2 below.

TABLE 2

| | | Pattern Loading | | |
|---|---|---|---|---|
| Feature Aspect Ratio | Top (avg, nm) | Sidewall (avg, nm) | Bottom (avg, nm) | Step Coverage (Sidewall/Top %) |
| Field | 19.14 | — | — | — |
| 2.5:1 | 19.97 | 20.09 | 19.43 | 100.6% |
| 6:1 | 18.99 | 19.30 | 19.13 | 102% |

Figure 6A:
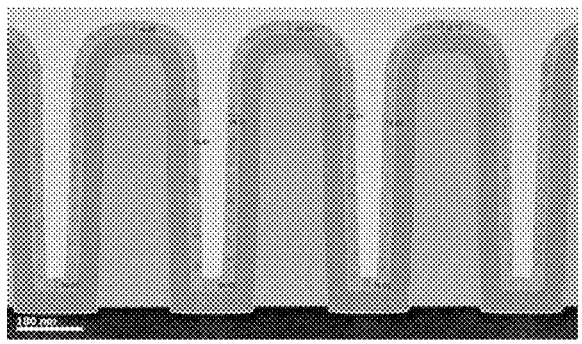
Figure 6B:
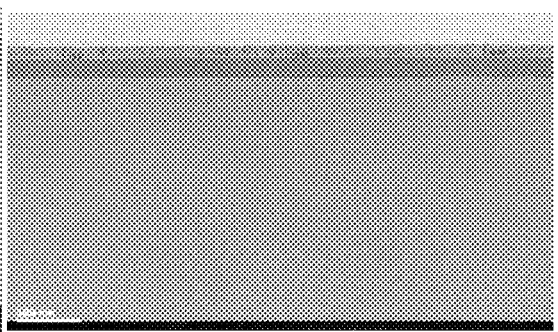

FIG. 5 is an image of the deposited aluminum nitride film on the 2.5:1 aspect ratio features. FIG. 6A is an image of the deposited aluminum nitride film on the 6:1 aspect ratio features. FIG. 6B depicts an image of the deposited aluminum nitride film on the field substrate. Layers deposited using disclosed embodiments were still conformal for features with an aspect ratio of up to about 1:6 and no pattern loading effect was observed.

Experiment 3

An experiment was conducted to evaluate film quality of deposited films in accordance with various embodiments. In this experiment, an aluminum nitride layer was deposited on a metal dielectric substrate with features at 350° C. and 0.1 Torr using cycles of a 7.5-second exposure of trimethylaluminum (TMA), a 2-second purge, a 30-second exposure of ammonia (NH$_3$), and a 6-second purge. The reaction was entirely thermal and no plasma was initiated. FIG. 5 is an image of the deposited aluminum nitride film before the wet etch test or dip.

The substrate was then subject to an SC2 wet etch test using a standard clean solution at 50° C. for a 25-second dip. The composition of the SC2 standard etchant/clean solution includes HCl, H$_2$O$_2$, and H$_2$O in a 1:1:5 composition ratio. The results of the measurements and calculations of step coverage are shown in Table 3 below.

TABLE 3

| | Film Quality | | |
|---|---|---|---|
| | Thickness (pre-dip) | Thickness (post-dip) | Etch Rate (Å/min) |
| Sidewall (avg, Å) | 200.9 | 179.7 | 51 |
| Top (avg, Å) | 199.7 | 177.8 | 53 |
| Bottom (avg, Å) | 194.3 | 173.5 | 50 |

Figure 7:
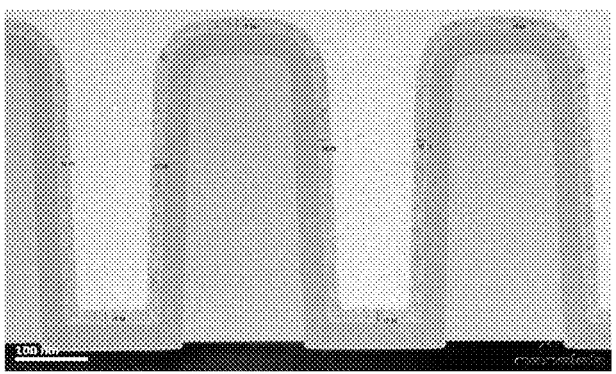

FIG. 7 is an image of the etched aluminum nitride film after the wet etch test. As shown the etch was uniform throughout the surface of the features. The calculated sidewall to top etch rate ratio was about 0.97. The film quality was comparable to that of conventional ALD. Even after the wet etch dip, the step coverage of the deposited film was still about 100%, thereby indicating that the film etches uniformly and etch rate is consistent over the deposited film. The results also show that the quality of the film on the sidewall is equivalent to the quality of the film in the field regions at the top and bottom of the structure despite having CVD-like reactions during deposition. This suggests that the film quality generated at the surface and the gas phase are equivalent or similar.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

What is claimed is:

1. A method of processing a semiconductor substrate having features in a reaction chamber, the method comprising:
    (a) exposing the substrate to an aluminum-containing precursor for a duration sufficient to substantially adsorb to a surface of the substrate;
    (b) purging the aluminum-containing precursor from the reaction chamber for a duration insufficient to remove substantially all of the aluminum-containing precursor from the gas phase;
    (c) exposing the substrate to a nitrogen-containing precursor for a duration sufficient to drive a thermally mediated reaction to form a layer of aluminum nitride on the surface of the substrate, wherein the layer of aluminum nitride is substantially conformal to the substrate and has a thickness of about 1.5 Å or greater;
    (d) purging the nitrogen-containing precursor in gas phase from the reaction chamber; and
    (e) repeating (a) through (d).

2. The method of claim 1, wherein the layer of aluminum nitride has step coverage of at least about 80%.

3. The method of claim 1, wherein the substrate is processed at a process temperature between about 250° C. and about 450° C.

4. The method of claim 1, wherein the substrate is processed at a pressure between about 0.01 Torr and about 10 Torr.

5. The method of claim 1, wherein the aluminum-containing precursor is trimethylaluminum (TMA).

6. The method of claim 1, wherein the nitrogen-containing precursor is ammonia (NH$_3$).

7. The method of claim 1, wherein purging the aluminum-containing precursor further comprises flowing nitrogen (N$_2$) and purging the nitrogen-containing precursor further comprises flowing nitrogen (N$_2$).

8. The method of claim 1, wherein the aluminum-containing precursor is purged for about 2 seconds.

9. The method of claim 1, wherein the substrate is exposed to the aluminum-containing precursor for about 7.5 seconds to about 30 seconds.

10. The method of claim 1, wherein the ratio of the time the substrate is exposed to the aluminum-containing precursor to the time the aluminum-containing precursor is purged is between about 3.75:1 and about 15:1.

11. The method of claim 1, wherein processing exhibits substantially no pattern loading.

12. The method of claim 1, wherein the amount of aluminum nitride deposited during a cycle of (a) through (d) is at least about 2 Å.

13. The method of claim 1, wherein the amount of aluminum nitride deposited during a cycle of (a) through (d) is at least about 5 Å.

14. The method of claim 1, wherein the features of the substrate have aspect ratios of at least about 2:1.

15. The method of claim 1, wherein the features of the substrate have openings of less than about 100 nm.

\* \* \* \* \*